United States Patent [19]
Nishimura

[11] Patent Number: 5,953,245
[45] Date of Patent: *Sep. 14, 1999

[54] SEMICONDUCTOR MEMORY DEVICE AND METHOD OF CONTROLLING IMPRINT CONDITION THEREOF

[75] Inventor: Kiyoshi Nishimura, Kyoto, Japan

[73] Assignee: Rohm Co., Ltd., Kyoto, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/958,746

[22] Filed: Oct. 31, 1997

[30] Foreign Application Priority Data

Nov. 21, 1996 [JP] Japan .................................. 8-309824

[51] Int. Cl.$^6$ .................................................. G11C 11/22
[52] U.S. Cl. .......................................... 365/145; 365/149
[58] Field of Search ...................................... 365/145, 149

[56] References Cited

U.S. PATENT DOCUMENTS

| | | | |
|---|---|---|---|
| 5,740,100 | 4/1998 | Yoo | 365/145 |
| 5,745,403 | 4/1998 | Taylor | 365/145 |
| 5,784,310 | 7/1998 | Cachiaro et al. | 365/145 |

*Primary Examiner*—Son T. Dinh
*Attorney, Agent, or Firm*—Majestic, Parsons, Siebert & Hsue P.C.

[57] ABSTRACT

A semiconductor memory device with a plurality of memory cells each having a ferroelectric material for storing a data item by its residual polarization is made usable selectably both as a RAM and as a ROM by controlling the so-called "imprint condition" of the ferroelectric material. When some of the memory cells are going to be used to a ROM or when the memory cells in an imprint condition are going to be used a RAM, heat and/or voltage pulses with an appropriate polarity are applied to the data-storing ferroelectric material to change its hysteresis characteristics.

20 Claims, 5 Drawing Sheets

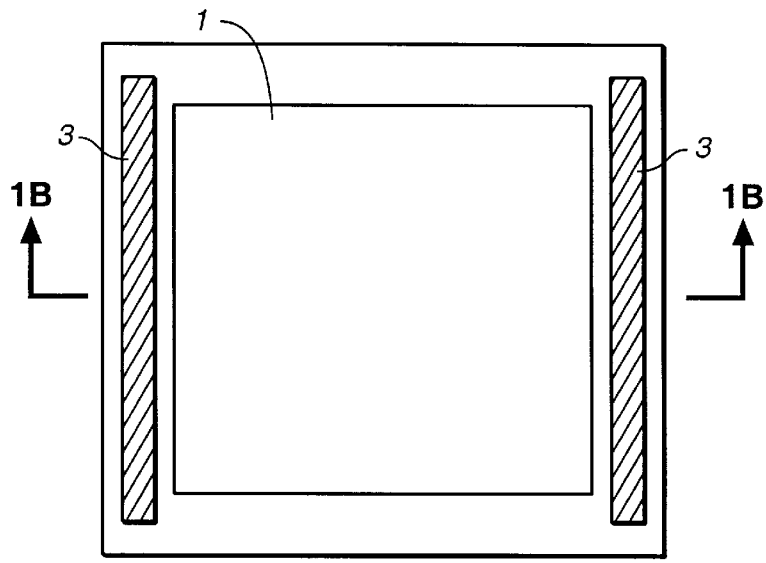
FIG._1A
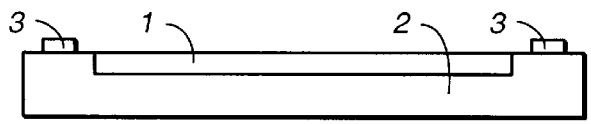
FIG._1B
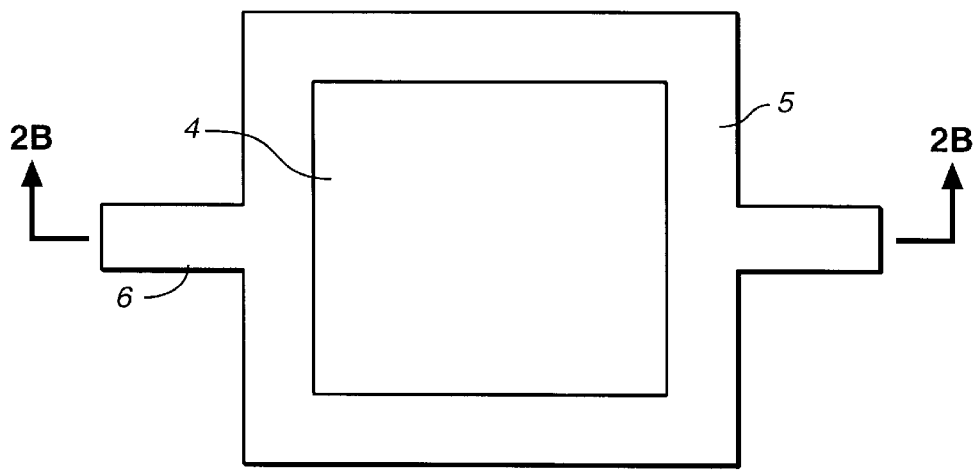
FIG._2A
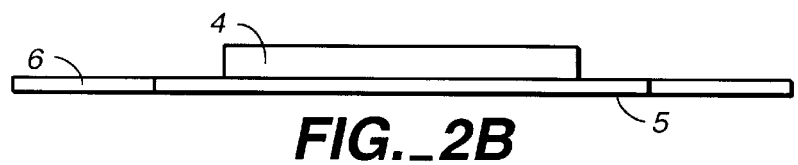
FIG._2B

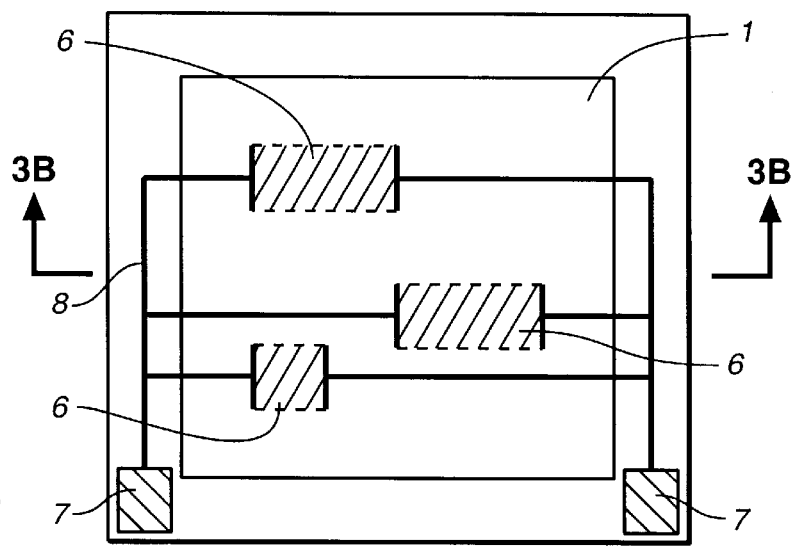
FIG._3A
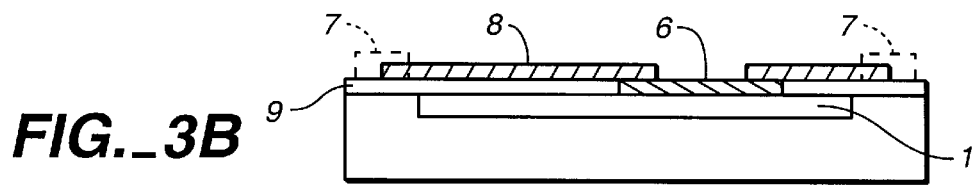
FIG._3B
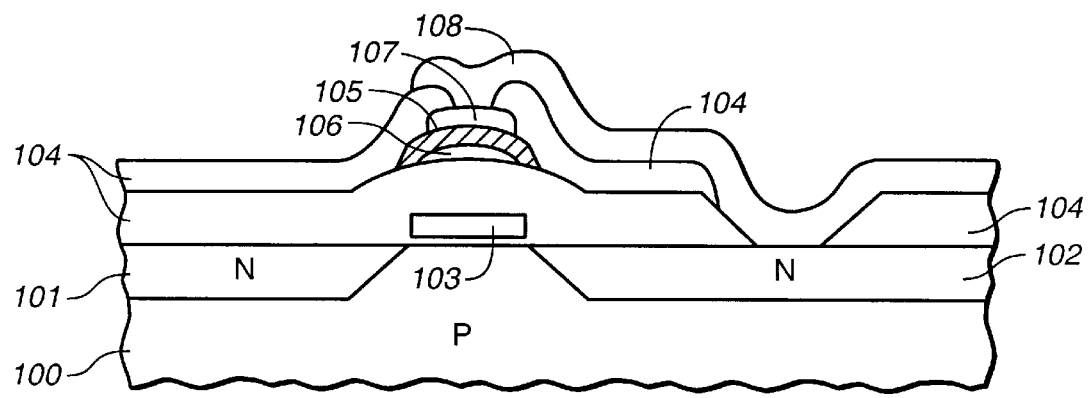
FIG._4A
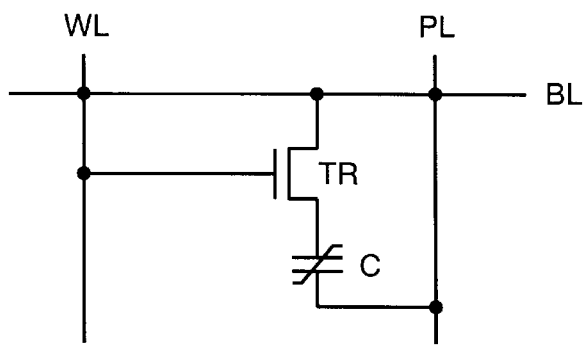
FIG._4B

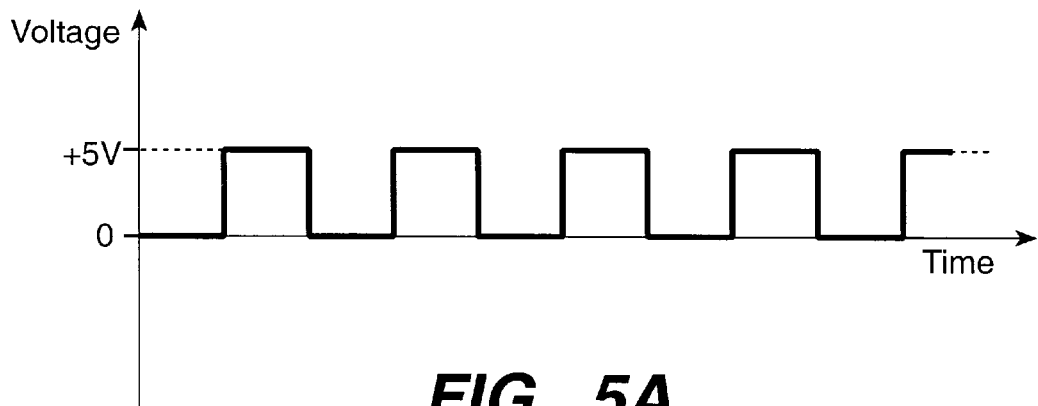
FIG._5A
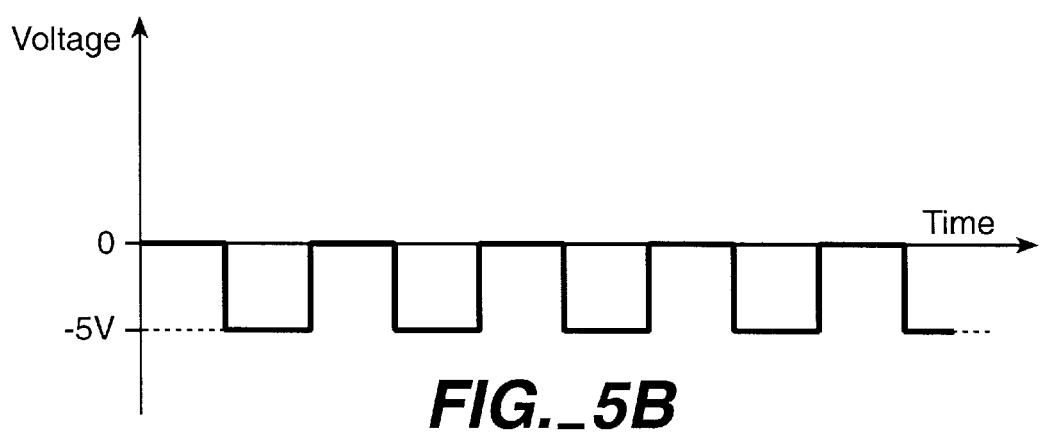
FIG._5B
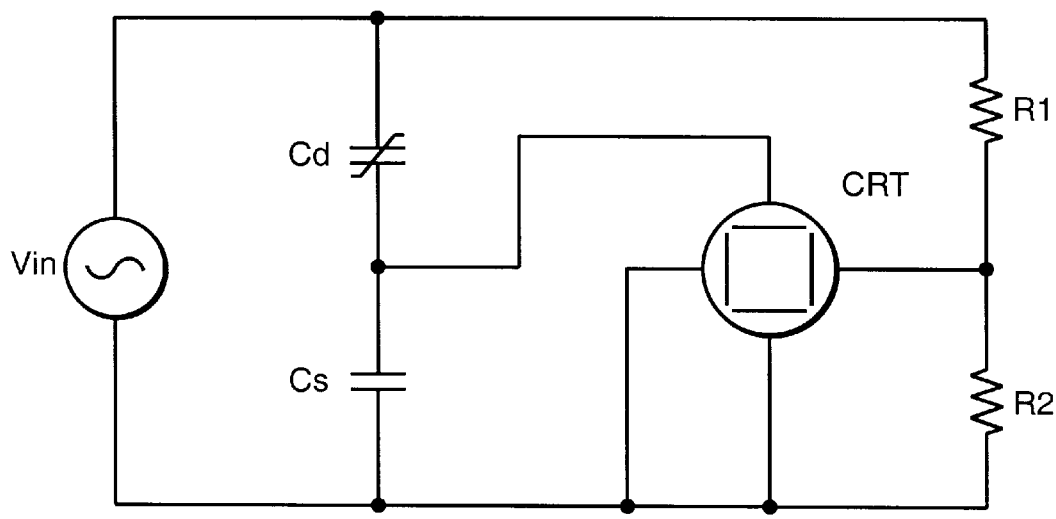
FIG._6

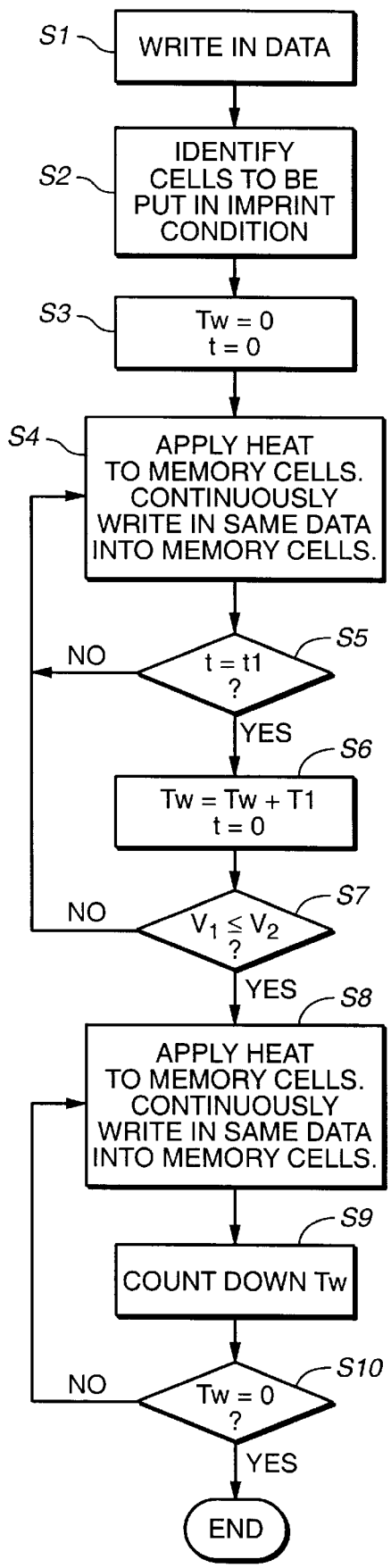
FIG._7A
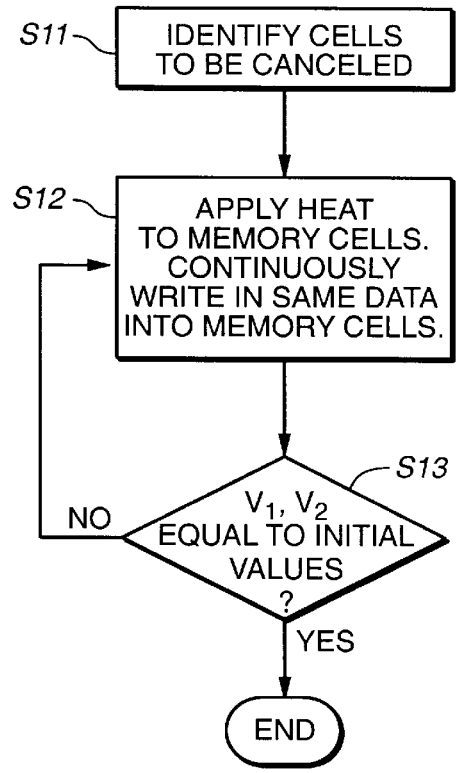
FIG._7B

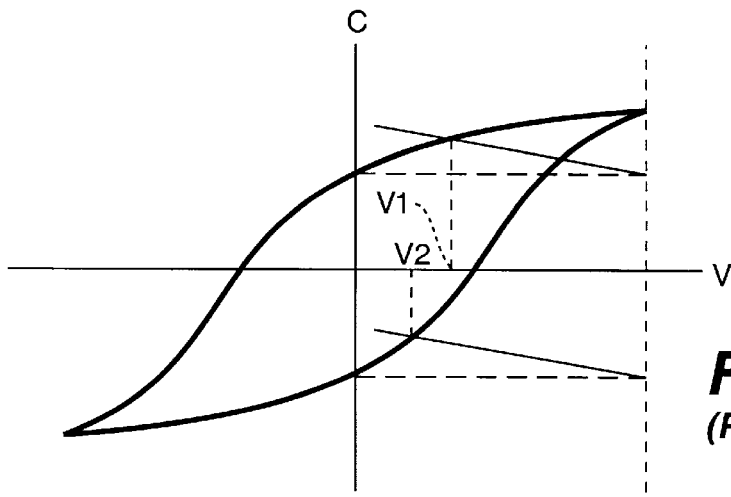
FIG._8A
(PRIOR ART)
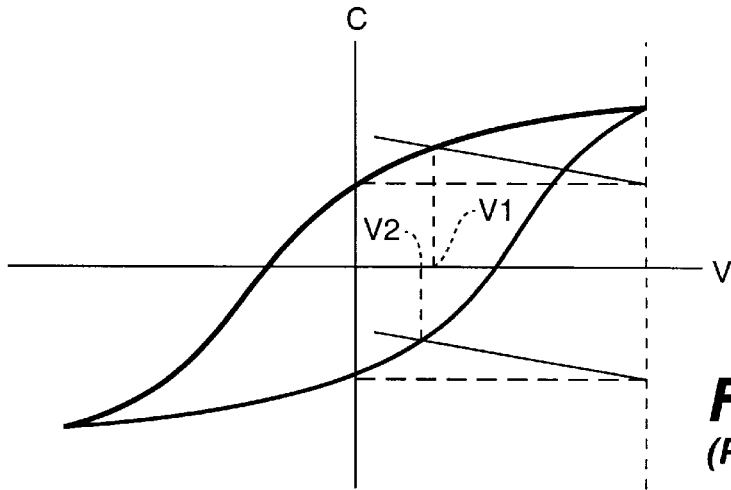
FIG._8B
(PRIOR ART)
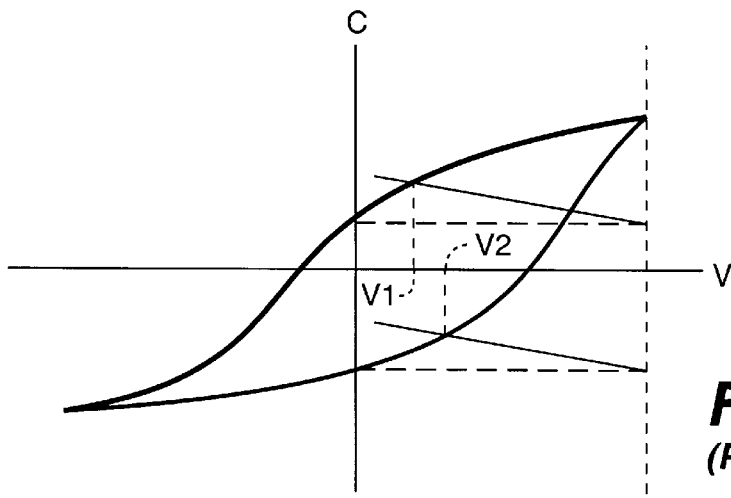
FIG._8C
(PRIOR ART)

SEMICONDUCTOR MEMORY DEVICE AND METHOD OF CONTROLLING IMPRINT CONDITION THEREOF

BACKGROUND OF THE INVENTION

This invention relates to a semiconductor memory device using a ferroelectric material.

From the point of view of write-in and read-out, memory devices may be divided into the RAM (random access memory) type which allows data to be written in and read out from any address and the ROM (read only memory) type which allows data only to be read therefrom. In other words, data can be written into a RAM and can be read therefrom and for this reason, the speeds of reading out and writing in data are usually set about equal to each other. As for a ROM, data can be read therefrom whenever they are needed but they cannot be written in, or may be written in but the speed of writing in data is set very much slower than the speed of reading them out. For this reason, a RAM is usually used for storing data which must be updated frequently, while a ROM is usually used for storing a program which does not have to be rewritten frequently.

Examples of a magnetic memory device include disk memories such as hard disks and floppy disks. Although they may be classified as a RAM because data can be freely written in and read out, they can also function as a ROM if a write-inhibiting means is provided so as to be used only for reading out data. In other words, a single memory device can sometimes be used both as a RAM and a ROM. As for optical memory devices such as CD-ROMs, they are used only for reading out data.

As for semiconductor memory devices, DRAMs and SRAMs may be cited as examples of RAMs while examples of ROM include mask ROMs, fuse-type bipolar PROMs (programmable read only memories) and diode destructible PROMs. Examples of a non-volatile semiconductor device include EPROMs (erasable PROMs) and EEPROMs (electrically erasable PROMs). DRAMs and SRAMs are not provided with any non-volatile characteristics like ROMs and cannot physically prevent write-in. On the other hand, aforementioned kinds of semiconductor ROMs cannot allow data to be freely written in and hence cannot serve as a RAM. In summary, unlike disk memories as an example of magnetic memory devices, there has not been developed yet a technology for making a semiconductor memory device to serve both as a RAM and, with the help of a write-inhibiting means, also as a ROM.

Recently, ferroelectric memory devices are being developed as an example semiconductor memory devices. Ferroelectric memories function to store data by means of residual polarization of a ferroelectric material and not only have non-volatility but also are capable of having data written in and read out at a high speed like DRAMs. In other words, ferroelectric memories can function as RAMs but they cannot serve as a ROM since they cannot inhibit write-in.

One of the technological problems involved in the development of ferroelectric memory devices has related to the so-called "imprint characteristic." This is the problem, for example, of the phenomenon that, if a data item such as "0" is stored in a memory cell for a long time such as several years and if an attempt is made thereafter to write "1" in this memory cell, the cell will find it difficult to store "1" but will return to the condition of storing "0." It is known that this phenomenon occurs when voltage pulses of a same polarity are successively applied or when heat is applied under a polarized condition. For this reason, it has been a common practice to apply voltage pulses continuously or heat in order to test the imprint characteristic by means of such a load.

Such an "imprint condition" at which it becomes difficult to write in a data item into a memory cell is now understood to be caused when the hysteresis characteristic of the ferroelectric material is deformed or shifted. FIGS. 8A, 8B and 8C show how the hysteresis curve becomes deformed from an initial condition shown in FIG. 8A to FIG. 8B and then to FIG. 8C.

When the hysteresis curve was as shown in FIG. 8A, for example, let us assume, as described in Japanese Patent Publication Tokkai 8-36888, that two voltage levels $V_1$ and $V_2$ are taken corresponding to a positive polarization condition and a negative polarization condition in order to distinguish data "0" and "1" and that a reference voltage $V_{ref}$ (not shown) is set between $V_1$ and $V_2$ such that a detected voltage $V_d$ at the time of detection is compared with this reference voltage $V_{ref}$ and the stored data item is identified as "1" or "0" respectively if $V_d > V_{ref}$ and $V_d < V_{ref}$.

As the hysteresis curve becomes deformed, as shown in FIGS. 8B and 8C, however, the difference between $V_1$ and $V_2$ becomes smaller and their size relationship may even become reversed, as shown in FIG. 8C. In such a situation, since voltage $V_1$ corresponding to data item "1" is smaller than the reference voltage $V_{ref}$, even if it is attempted to write "1" where it was "0", the stored data item may not necessarily be recognized as "0". In other words, the memory cell seems to go back to the initial condition before the rewriting is effected, and this is the so-called imprint condition.

It has indeed been ascertained that the so-called imprint condition does not mean that the memory condition of a memory device has irreversibly affixed but that the memory device goes back to its initial condition even if voltage pulses of the polarity corresponding to a data item opposite to the stored data item are repeated applied.

The aforementioned imprint characteristic has been considered as a kind of deterioration in the characteristics of a memory device. From a different point of view, however, this property that the memory condition is kept unchanged as before even if an attempt is made to write in a new data item may be considered to be similar to the function of inhibiting write-in, say, into a disk memory of a magnetic memory device, as explained above.

It is therefore an object of this invention to affirmatively make use of the imprint characteristic in a memory device such that a semiconductor memory device, which already has the functions of a RAM, can also function as a ROM.

SUMMARY OF THE INVENTION

A semiconductor memory device embodying this invention, with which the above and other objects can be accomplished, may be characterized as comprising not only a plurality of memory cells with a ferroelectric material so as to remain in a data-storing condition by the residual polarization of this ferroelectric material, but also an imprint controlling means for controlling the imprint condition of the ferroelectric material of at least one of these memory cells. This imprint controlling means comprises a heat-applying means for applying heat to the ferroelectric material of the memory cell and/or a voltage-applying means for applying a pulsed voltage of the same polarity to the memory cell continuously for a specified length of time. This voltage-applying means serves to accelerate the imprint condition of the ferroelectric material by applying to the memory cell voltage pulses of the same polarity as that which indicates the stored data item of the memory cell and to cancel the imprint condition by applying to the memory cell voltage pulses of the polarity which is opposite to that which indicates the stored data item. The heat-applying means serves to apply heat to the ferroelectric material so as to accelerate the imprint condition of the ferroelectric material or its cancellation.

The semiconductor memory device further comprises a detecting means for detecting the hysteresis characteristic of the ferroelectric material of the memory cell, and the imprint control means serves to operate from the initial moment when it begins to operate until this detecting means a hysteresis characteristic which indicates the imprint condition and further continuously for an extra length of time which is approximately the same as the first period.

A method of this invention for controlling the imprint condition of a semiconductor memory device as described above may be characterized as comprising the steps of continuously applying to the memory cell, holding a data item in an imprint condition, voltage pulses of polarity opposite to that which indicates the stored data item of the memory cell for a specified length of time and applying heat so as to accelerate the cancellation of the imprint condition such that the imprint condition will be canceled. In this method, the imprint condition is caused by applying heat so as to accelerate the imprint condition and/or by continuously applying voltage pulses of the same polarity as that which indicates the stored data item of the memory cell for a specified length of time.

In summary, a semiconductor memory device of this invention causes an imprint condition in a memory cell through its imprint control means so as to prevent data from being written in and to cancel the generated imprint condition so that a new data item can be written in. In other words, the switch-over between the functions of a RAM and a ROM is carried out by the imprint control means. The method of control according to this invention is characterized by the step of applying both heat and voltage pulses of a selected polarity so as to cancel the imprint condition of a data-storing memory cell such that the imprint condition can be easily canceled.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 1A is a plan view of a semiconductor memory device according to a first embodiment of this invention and FIG. 1B is its sectional view taken along line 1B—1B in FIG. 1A;

FIG. 2A is a plan view of a semiconductor memory device according to a second embodiment of this invention and FIG. 2B is its sectional view taken along line 2B—2B in FIG. 2A;

FIG. 3A is a plan view of a semiconductor memory device according to a third embodiment of this invention and FIG. 3B is its sectional view taken along line 3B—3B in FIG. 3A;

FIG. 4A is a sectional view of a memory cell and FIG. 4B is an equivalent circuit diagram of the memory cell;

FIGS. 5A and 5B are graphs of a voltage pulses;

FIG. 6 is a circuit diagram of a detection circuit;

FIGS. 7A and 7B are flow charts for the generation and cancellation of an imprint condition according to a method of this invention; and FIGS. 8A, 8B and 8C are hysteresis curves showing the generation of an imprint condition.

DETAILED DESCRIPTION OF THE INVENTION

FIGS. 1A and 1B show a semiconductor memory device according to a first embodiment of this invention. In general, expression "semiconductor memory device" is used to indicate a device as a whole, including not only memory cells but also data processing means for processing data in the memory cells. In the description of examples which follows, however, only the portions which characterize the invention will be mainly explained and the other portions may be ignored. It is still to be understood that within the context of this invention, expression "semiconductor memory device" include not only memory cells but also systems which include memory cells.

In FIGS. 1A and 1B, numeral 1 indicates a memory part formed, say, on a silicon substrate by a conventional semiconductor process such as an epitaxial method, patterning and injection of impurities. The cell structure of the memory part 1 may be, for example, as shown in FIG. 4A, having an equivalent circuit diagram shown in FIG. 4B. Explained more in detail, the memory part 1 includes a selection transistor TR which is a MOSFET and a memory capacitor C containing a ferroelectric material, the source, the gate and the drain of the selection transistor TR being connected respectively to a bit line BL, an word line WL and one of the electrodes of the memory capacitor C. The other electrode of the memory capacitor C is connected to a plate line PL. As a signal is received by the selection transistor TR through the word line WL, the bit line BL and the memory capacitor C are connected such that a data item can be written into or read out of the memory capacitor C.

As shown in FIG. 4A, the selection transistor TR is formed by forming an N-type source 101 and drain 102 on a P-type silicon substrate 100 and depositing a layer of polysilicon gate 103 on the N-channel portion therebetween. An insulating layer 104 comprising a silicon oxide film is deposited thereon, and a memory capacitor C having a ferroelectric membrane 105 of PZT sandwiched between a lower electrode 106 and an upper electrode 107 is formed thereon. The upper electrode 107 of the memory capacitor C is connected to the drain 102 of the selection transistor TR through a conductive layer 108 which may comprise Al.

Many memory cells, as described above, are formed in the memory part 1 of FIG. 1. The memory part 1 itself is formed as an island on the silicon substrate, surrounded by a heat-emitting part 2. As a current is passed through electrodes 3 formed on the surface of this heat-emitting part 2, heat is emitted from the heat-emitting part 2 and is applied to the memory part 1. In summary, the example shown in FIG. 1 is characterized as using the heat-emitting part 2 as the imprint means and also as containing this heat-emitting part 2 within the device. As a practical example, the memory may be brought into an imprint condition by applying heat for several hours to the memory part 1 at 150–200° C.

Alternatively, the memory may be brought into an imprint condition by applying voltage pulses as shown in FIG. 5A or 5B for several hours (about $10^7$ times) continuously from the bit line BL shown in FIG. 4B to thereby continuously write in a same data item. In this case, pulses with negative voltage (as shown in FIG. 5B) are applied if the ferroelectric material of the memory capacitor C is in a negative polarization condition and pulses with positive voltage (as shown in FIG. 5A) are applied if the ferroelectric material of the memory capacitor C is in a positive polarization condition. In other words, data having the same polarity as the polarization condition of the ferroelectric material of the memory capacitor C must be written in. An imprint condition can be efficiently generated under a heated condition of about 150° C. by applying voltage pulses for only several minutes. In other words, although an imprint condition can be generated by applying only heat or only voltage pulses but there is a multiplicative effect such that an imprint condition can be generated very quickly if both heat and voltage pulses are applied at the same time.

When a memory device is in an imprint condition, it serves as a ROM because the memory contents of the memory cells are not affected even if it is attempted to write in data which are different from the imprinted data.

If it is desired to use a memory device in an imprint condition again as a RAM into which different data can be written, one has only to cancel this imprint condition, say, by continuously applying voltage pulses having polarity opposite from that of the imprinted data (as shown in FIG. 5A or 5B) while causing a current to flow to the heat-emitting part 2 to raise the temperature of the memory part. In the case of PZT, the imprint condition can be canceled at 150–200° C.

Such a method for controlling the imprint condition of a memory device can be effective not only for canceling an imprint condition by applying voltage pulses and heat as described above but also in the case of an imprint condition brought about after data have been in storage for a long period of time such as several years. In such a situation, the memory device in an imprint condition is set in a control device provided with means for applying heat and voltage pulses as described above to cancel the imprint condition of the memory device and then new data are written in into the rejuvenated memory device.

In order to detect the generation and/or cancellation of an imprint condition, one or more detection capacitors may be contained in the memory part 1. It is preferable to have several such detection capacitors distributed throughout in order to improve the accuracy of detection. The detection capacitors are structured similarly to the memory capacitors of the memory cells and since they are placed in the same environment as the memory capacitors, they go into an imprint condition and their imprint conditions are canceled nearly as do the memory capacitors. Thus, the condition of a memory capacitor can be monitored by detecting the characteristics of a detection capacitor.

The hysteresis characteristics of a detection capacitor Cd can be detected, for example, by means of a detection device shown in FIG. 6, comprising a so-called Sawyer-Tower circuit, wherein capacitor Cs with a much larger capacitance than the detection capacitor Cd is used. If an input voltage $V_{in}$, given by $V_{in}=V\sin\omega t$, for example, is be applied, a hysteresis curve as shown in FIG. 8 is obtained on a CRT.

The routine for the generation and cancellation of an imprint condition, as described above, is summarized in a flow chart shown in FIGS. 7A and 7B. For generating an imprint condition, data are initially written in a memory device from a data processing device such as a CPU (Step S1) and then the memory cells with data not to be overwritten are identified (Step S2). Next, parameters Tw for indicating the time for write-in and t for counting time are reset to zero (Step S3) and the application of heat and voltage pulses and the write-in of data are started (Step S4). After a specified time t1 has elapsed (Yes in Step S5), t1 is added to Tw and t is reset (Step S6). Next, the hysteresis curve of the capacitor Cd is detected by the detecting apparatus described above to check whether the voltage level $V_1$ has become lower than the voltage level $V_2$ as explained with reference to FIGS. 8A–8C (Step S7). If $V_1$ remains to be higher than $V_2$, the routine goes back to Step S4 to continue the write-in process. If the deformation of the hysteresis curve has sufficiently advanced and $V_1$ is found to be lower than $V_2$, the routine proceeds to Step S8 wherein application of heat and voltage pulses is started as in Step S4 but the counting down of time is started at this time (Step S9) and the process is stopped when the counter counts down from Tw to zero (YES in Step S10). With reference to this flow chart, the application of heat and voltage pulses is continued for a period which is approximately the same as the time between the start of application until an imprint condition is detected (that is $V_1<V_2$ is detected). This is because the memory device may go back from the imprint condition if the process is terminated immediately after the imprint condition has been reached. It is also to be noted, as explained above, that although both heat and voltage pulses are applied according to the flow chart, this is not a requirement according to this invention because an imprint condition can be generated by the application of heat alone or voltage pulses alone. Moreover, although the flow chart shows that the detection of the hysteresis characteristics of the detection capacitor Cd is carried out at intervals of t1, the detection may be carried out continuously or only after the imprint condition has been approached. Similarly, the period of time for the continued application of heat and/or voltage pulses may be further increased.

FIG. 7B shows a cancellation flow for showing the process for canceling an imprint condition. After the memory cells where cancellation should be effected are identified (Step S11), application of heat and voltage pulses as well as write-in of data with opposite polarity are started (Step S12). The detection device detects the hysteresis characteristics of the detection capacitor Cd to check whether $V_1$ and $V_2$ have returned to their initial levels (Step S13). If $V_1$ and $V_2$ have not returned to their initial values (NO in Step S13), the program goes back to Step S12 to resume the application of heat and voltage pulses. If $V_1$ and $V_2$ are found to have returned to their initial values (YES in Step S13), the cancellation process is then terminated. The remarks made above with reference to FIG. 7A are also applicable to the cancellation flow, that is, application of heat alone or voltage pulses alone may be sufficient and the hysteresis characteristics of the detection capacitor Cd may be carried out continuously or at intervals.

By appropriately combining an imprint flow such as shown in FIG. 7A and a cancellation flow such as shown in FIG. 7B, a memory device serving as a RAM can be converted into a ROM and then back to a RAM whenever a switch-over is required. Moreover, such processes may be repeated for any number of times without affecting the characteristics of the ferroelectric material adversely to any significant degree.

Although the invention has been described above with reference to only one embodiment shown in FIGS. 1A and 1B, but this is not intended to limit the scope of the invention. Many modifications and variations are possible within the scope of the invention. For example, FIGS. 2A and 2B show another semiconductor memory device according to a second embodiment of this invention characterized as not having the heat-emitting means contained in the substrate but having it attached from outside. In FIGS. 2A and 2B, numeral 4 indicates a silicon substrate having a memory part formed thereon as shown in FIGS. 1A and 1B. A frame 5, made of a copper alloy or nickel alloy material, is intimately attached to the substrate 4, serving as a heat-emitting body itself when a current is introduced thereinto through its connector part 6. In summary, heat is applied to the memory part on the substrate 4 by supplying a current to the frame 5. This embodiment is the same as the first embodiment in other respects such as the manner of applying voltage pulses.

FIGS. 3A and 3B show still another semiconductor memory device according to a third embodiment of the invention, characterized as applying heat only to a portion of the memory part, unlike the first and second embodiments of the invention wherein heat is applied to the whole of the memory part. As shown in FIG. 3B, a silicon oxide layer 9 is formed above the memory part 1, and a conductor layer 8 is formed with Al on the silicon oxide layer 9 to be connected to electrodes 7. Portions 6 (shaded in FIG. 3A) of the silicon oxide layer 9 corresponding to memory cells, which are portions of the memory part 1, are connected to the conductor layer 8 so as to function as heat-emitting parts. These heat-emitting parts 6 may comprise a material such as polysilicon or aluminum or may be formed as "well" parts produced by the diffusion of impurities, and are connected to the electrodes 7 through wires so as to emit heat when a current is passed therethrough and to apply heat to selected portions of the memory cells intended to be brought into an imprint condition. This embodiment is useful when memory cells to be converted into ROMs are preliminarily determined.

Although FIGS. 3A and 3B show an example whereby heat-emitting parts are formed above the memory part but this is not intended to limit the scope of the invention. The heat-emitting parts of this kind may equally well be formed below the memory part. This can be done, for example, by forming a polysilicon or aluminum layer, say, by patterning, below the memory part.

Advantages gained by the present invention include the following:

(1) Since data stored in memory cells can be placed in an imprint condition, they can be effectively protected by erroneous rewriting operations;

(2) Since data which have once been put in an imprint condition can be rewritten by means of a refresh operation, and hence data can be effectively corrected without exchanging the memory device as a whole;

(3) An imprint condition which naturally occurred after a long period of storage can be easily canceled and hence the memory device can be used again, this effectively improving the effective lifetime of the memory device; and (4) If the heat-emitting means is included in the semiconductor memory device, this serves to save electric power and the device does not become bulky even if such means are attached externally.

What is claimed is:

1. A semiconductor memory device comprising:

plurality of memory cells each having a ferroelectric material for storing a data item by residual polarization of said ferroelectric material; and an imprint control means for generating and canceling an imprint condition of the ferroelectric material of at least one of said memory cells, said memory cells being unaffected, when in said imprint condition, by attempts to store therein another data item which is different from a currently stored data item therein.

2. The semiconductor memory device of claim 1 wherein said imprint control means includes at least one selected from the group consisting of heating means for applying heat to the ferroelectric material of said memory cell and voltage-applying means for applying voltage pulses of a same polarity to said memory cell continuously over a specified length of time.

3. The semiconductor memory device of claim 2 wherein said voltage-applying means serves to accelerate said imprint condition of said ferroelectric material by applying to said memory cell voltage pulses of a polarity which is the same as the polarity which indicates the data item stored in said memory cell.

4. The semiconductor memory device of claim 2 wherein said voltage-applying means serves to cancel said imprint condition by applying to said memory cell voltage pulses of a polarity which is opposite to that which indicates the data item stored in said memory cell.

5. The semiconductor memory device of claim 3 wherein said voltage-applying means further serves to cancel said imprint condition by applying to said memory cell voltage pulses of a polarity which is opposite to that which indicates the data item stored in said memory cell.

6. The semiconductor memory device of claim 2 wherein said heat-applying means serves to accelerate said imprint condition of said ferroelectric material and the cancellation of said imprint condition of said ferroelectric material by applying heat to said ferroelectric material.

7. The semiconductor memory device of claim 3 wherein said heat-applying means serves to accelerate said imprint condition of said ferroelectric material and the cancellation of said imprint condition of said ferroelectric material by applying heat to said ferroelectric material.

8. The semiconductor memory device of claim 4 wherein said heat-applying means serves to accelerate said imprint condition of said ferroelectric material and the cancellation of said imprint condition of said ferroelectric material by applying heat to said ferroelectric material.

9. The semiconductor memory device of claim 5 wherein said heat-applying means serves to accelerate said imprint condition of said ferroelectric material and the cancellation of said imprint condition of said ferroelectric material by applying heat to said ferroelectric material.

10. The semiconductor memory device of claim 1 further comprising a detection means for detecting the hysteresis characteristics of said memory cell.

11. The semiconductor memory device of claim 2 further comprising a detection means for detecting the hysteresis characteristics of said memory cell.

12. The semiconductor memory device of claim 3 further comprising a detection means for detecting the hysteresis characteristics of said memory cell.

13. The semiconductor memory device of claim 4 further comprising a detection means for detecting the hysteresis characteristics of said memory cell.

14. The semiconductor memory device of claim 5 further comprising a detection means for detecting the hysteresis characteristics of said memory cell.

15. The semiconductor memory device of claim 10 wherein said imprint control means initially operates for a first period of time from a start-up time until said detection means detects a hysteresis characteristic which indicates said imprint condition and thereafter continues to operate for another period which is at least about the same as said first period.

16. The semiconductor memory device of claim 11 wherein said imprint control means initially operates for a first period of time from a start-up time until said detection means detects a hysteresis characteristic which indicates said imprint condition and thereafter continues to operate for another period which is at least about the same as said first period.

17. The semiconductor memory device of claim 12 wherein said imprint control means initially operates for a first period of time from a start-up time until said detection means detects a hysteresis characteristic which indicates said imprint condition and thereafter continues to operate for another period which is at least about the same as said first period.

18. The semiconductor memory device of claim 13 wherein said imprint control means initially operates for a first period of time from a start-up time until said detection means detects a hysteresis characteristic which indicates said imprint condition and thereafter continues to operate for another period which is at least about the same as said first period.

19. A method of controlling imprint conditions of a semiconductor memory device comprising a plurality of memory cells each provided with a ferroelectric material, at least one of said memory cells holding a data item in the ferroelectric material in an imprint condition, unaffected by attempts to store therein another data item which is different from the currently stored data item therein, said method comprising the step of canceling the imprint condition of said one memory cell by applying thereto continuously over a specified period of time voltage pulses with polarity opposite to the polarity which indicates the data item held in said one memory cell and applying heat so as to accelerate cancellation of said imprint condition.

20. The method of claim 19 wherein said imprint condition is generated by at least one step selected from the group consisting of applying heat so as to accelerate said imprint condition and applying continuously for a specified period of time voltage pulses having polarity which is the same as that which indicates the data item stored in said memory cell.

* * * * *